(12) United States Patent
Kazama et al.

(10) Patent No.: US 6,975,111 B2
(45) Date of Patent: Dec. 13, 2005

(54) METHOD AND DEVICE FOR MEASURING INTENSITY OF ELECTROMAGNETIC FIELD, METHOD AND DEVICE FOR MEASURING CURRENT-VOLTAGE DISTRIBUTION, AND METHOD FOR JUDGING QUALITY OF ELECTRONIC DEVICE, AND ELECTRONIC DEVICE THEREOF

(75) Inventors: Satoshi Kazama, Miyagi (JP); Masakazu Fujita, Miyagi (JP); Masayuki Shimizu, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 235 days.

(21) Appl. No.: 10/237,719

(22) Filed: Sep. 10, 2002

(65) Prior Publication Data

US 2003/0006786 A1 Jan. 9, 2003

Related U.S. Application Data

(63) Continuation of application No. 09/481,689, filed on Jan. 12, 2000, now Pat. No. 6,456,070.

(51) Int. Cl.[7] .................. G01R 33/00; G01R 27/04
(52) U.S. Cl. .................. 324/260; 324/263; 324/632
(58) Field of Search ................. 324/260, 263, 324/632, 95, 750, 357, 371, 457, 529, 530, 167, 179, 144, 637, 258, 133, 72; 343/703, 743

(56) References Cited

U.S. PATENT DOCUMENTS

| 3,611,382 A | 10/1971 | Gray | 342/362 |
|---|---|---|---|
| 5,231,346 A | * 7/1993 | Gassmann | 324/95 |
| 5,300,879 A | 4/1994 | Masuda et al. | 324/95 |
| 5,773,974 A | 6/1998 | Kraz | 324/258 |
| 5,825,331 A | 10/1998 | Lee | 343/703 |
| 6,114,860 A | 9/2000 | Yun | 324/637 |

OTHER PUBLICATIONS

Kami, Yoshio et al., "Measurement of Magnetic Near Fields on Printed Circuit Boards by Using a Magnetic Loop Antenna," The University of Electro–Communications, Chofu–shi, Tokyo, Japan No data.

Yabukami, S., et al., "HF–UHF Band Electromagnetic Measurements Using Multi–Layer Printed Wiring Board," Research Institute of Electrical Communication, Tohoku University, Sendai, Japan, 1997.

Yabukami, S., et al., "HF–UHF Band Electromagnetic Measurements Using Multi–Layer Printed Wiring Board," Research Institute of Electrical Communication, Tohoku University, Sendai, Japan, 1997 (English Abstract).

(Continued)

*Primary Examiner*—Anjan Deb
*Assistant Examiner*—Timothy J. Dole
(74) *Attorney, Agent, or Firm*—Lowe, Hauptman & Berner, LLP

(57) ABSTRACT

A conductor is disposed within an area where electric coupling and magnetic coupling take place between the conductor and a device-under-test (DUT) in at least a portion of frequency band width, and the value of composite currents that is outputted in a plurality of directions different from each other against the DUT, is measured. Based on the measured plurality of values of the composite currents, the first electric current due to electric coupling between the DUT and the conductor and the second electric current due to magnetic coupling between the DUT and the conductor are calculated. From these first and second electric current values, electric field intensity and magnetic field intensity are calculated.

12 Claims, 8 Drawing Sheets

OTHER PUBLICATIONS

Namba, Akihiro, et al., "Measurement of Near–Field Emission from Printed Circuit Board using Miniature E–Field Probe," Faculty of Engineering, Okayama University, Okayama, Japan, 1998.

Namba, Akihiro, et al., "Measurement of Near–Field Emission from Prited Circuit Board Using Miniature E–Field Probe," Faculty of Engineering, Okayama University, Okayama, Japan, 1998 (English Abstract).

Wabuka, Hiroshi, et al., "Estimation of the RF Current a IC Power Terminal Using Magnetic Probe with Multilayer Structure," Resources and Environment Protection Research Laboratories, NEC Corporation, Kanagawa, Japan, 1998.

Wabuka, Hiroshi, et al., "Estimation of the RF Current at IC Power Terminal Using Magnetic Probe with Multilayer Structure," Resources and Environment Protection Research Laboratories, NEC Corporation, Kanagawa, Japan, 1998 (English Abstract).

Kurouchi, Toshiaki, et al., "Research of Noise Measurement Technology in Minute Area," Tochigi Prefectural Government, Tochigi–Pref Industrial Technology Center, Tochigi, Japan, 1994.

Kurouchi, Toshiaki, et al., "Research of Noise Measurement Technology in Minute Area," Tochigi Prefectural Government, Tochigi–Pref Industrial Technology Center, Tochigi, Japan, 1994 (English Abstract).

* cited by examiner

METHOD AND DEVICE FOR MEASURING INTENSITY OF ELECTROMAGNETIC FIELD, METHOD AND DEVICE FOR MEASURING CURRENT-VOLTAGE DISTRIBUTION, AND METHOD FOR JUDGING QUALITY OF ELECTRONIC DEVICE, AND ELECTRONIC DEVICE THEREOF

CROSS-REFERENCE TO RELATED APPLICATIONS

This application is a continuation of U.S. patent application Ser. No. 09/481,689 filed on Jan. 12, 2000 now U.S. Pat. No. 6,456,070.

BACKGROUND OF THE INVENTION

1. Field of the Invention

The present invention relates to a method and a device for measuring intensity of electromagnetic field which is formed by electromagnetic waves radiated outward from various kinds of electronic device.

2. Description of the Prior Art

As a method for measuring intensity of electromagnetic field due to electromagnetic waves radiated outward from electronic device as a measure to cope with EMI (ElectroMagnetic Interference), those such as described below have been specified. As an example, nominated is a method to implement measurement with a device-under test (DUT) being a piece of electronic device as an measurement object being disposed in an open space, and with a loop antenna or a dipole antenna being disposed at a distance of 3 m to 10 m from this DUT. Thus, in the case where an antenna has been disposed at an ample distance from the DUT, the loop antenna can measure only magnetic component of the far-remote radiation electromagnetic field, and the dipole antenna can measure only electric field component thereof. And one component of the far-remote radiation electromagnetic field being measured, the other can be calculated. In addition, a method for implementing measurement not in an open space but in a radio darkroom has also been specified.

On the other hand, there is also a case where the radiation source of an electromagnetic wave is specified. For example, this takes place in the case where it is specified that from which part on a circuit substrate the electromagnetic wave is being intensively radiated. In such a case, unlike the said measurement, the intensity of electromagnetic field is measured adjacent to the DUT. In general, a small loop antenna is made to approach the DUT and the magnetic field component is measured. That is, in this method, the magnetic field component of the electromagnetic field due to the DUT is measured by using the dielectric electromotive force due to magnetic coupling. In addition, based on the result of this measurement, current-voltage distribution in the DUT is obtained and the radiation source is specified.

Incidentally, a method utilizing the said open space or radio darkroom requires a vast disposing space and a large amount of device investment. Therefore, in recent years, as an assessment method on intensity of radiated electromagnetic waves, an assessment method utilizing a coaxial transmission line called TEM Cell (Transverse ElectroMagnetic Cell) attracts public attention. In this assessment method, assessment is implemented with a DUT being disposed between interior conductor and exterior conductor of the coaxial transmission line, and based on signals to be outputted from one end of interior conductor. This method is advantageous in its capability to implement assessment with a comparatively small device.

However, the method utilizing the TEM Cell has presented a problem that it cannot give correlation with measurement in an open space. That is, the problem is that since the DUT and the interior conductor come in close vicinity to each other in terms of distance, the output current from the TEM Cell can no longer ignore the current due to magnetic coupling and the current due to electric coupling.

On the other hand, it is necessary to exclude influence by electric field component for the purpose of specifying in good accuracy the radiation source of the electromagnetic waves utilizing the said loop antenna. Therefore, shielded loop antenna in which a loop antenna has undergone shielding are often used. With this shielded loop antenna, which is hardly influenced by the electric field component, measurement only on the magnetic field component can be implemented comparatively highly accurately.

However, even with a shielded loop antenna, which will give rise to an electric field coupling between itself and the test sampling device in the section having not undergone shielding due to its configuration problems, it will be difficult to measure only magnetic field component accurately. In addition, configuration comprising shielded sections makes it difficult to implement miniaturization. That is, it was difficult to improve resolution capacity.

SUMMARY OF THE INVENTION

A purpose of the present invention is to provide a method as well as a device which can measure the electric field component and the magnetic field component respectively of intensity of electromagnetic field surrounding a DUT with small and simple device easily and accurately.

To achieve this goal, the present invention proposes a method for measuring intensity of electromagnetic field surrounding a DUT, wherein a conductor is disposed within an area where electric coupling and magnetic coupling take place between the conductor and the DUT in at least a portion of frequency band width, and the value of composite currents of a first current being outputted from the conductor due to electric coupling between the DUT and the conductor and a second current being outputted from the conductor due to magnetic coupling between the DUT and the conductor, said composite currents being outputted in a plurality of directions different from each other, is respectively measured, and based on the plurality of composite current values as well as the output direction thereof, the said first current value and the second current value are calculated, and based on the said first current value and the second current value, intensity of electric field as well as intensity of magnetic field are respectively calculated.

In the present invention, the conductor is disposed within an area where it undergoes electric coupling as well as magnetic coupling with the DUT, and therefore from the conductor, composites current of the first current due to the electric coupling and the second current due to the magnetic coupling is outputted. Here, the first current is outputted in the direction departing from the DUT being the radiation source of electromagnetic waves. On the other hand, the second current is outputted in a specific direction corresponding with the shape of conductor or positional relationship between the conductor and the DUT. That is, the values of composite currents to be outputted in a plurality of directions different from each other from the conductor to the DUT will be different values corresponding with the output directions. Accordingly, a plurality of composite current values, which are measured in different output directions, make it possible to calculate the first current as well as the second current from a plurality of measured composite current values. And, with this first and the second current values, the electric field component and the magnetic field component of the electromagnetic field can be measured accurately.

Purposes, configurations, and advantages other than the said on the present invention will become apparent in the following detailed descriptions.

DESCRIPTION OF THE PREFERRED EMBODIMENTS

The first embodiment of the present invention will be described with reference to drawings. A measuring device on intensity of an electromagnetic field measures intensity distribution of electromagnetic field in close vicinity to a DUT 1. The DUT 1 is, for example, a circuit substrate for electronic device. When measurement is implemented, the DUT 1 is made to stay in operation. The measuring device measures intensity of the electromagnetic field being formed by the electromagnetic waves radiated from the DUT 1 in operation.

Figure 1:
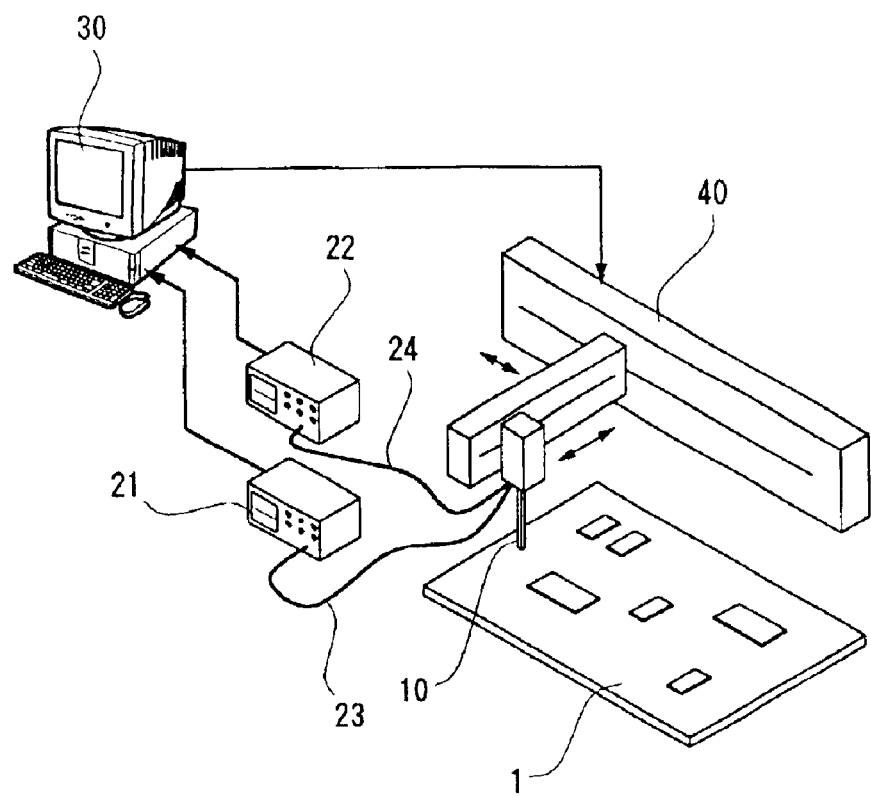
FIG. 1 is an explanatory view describing the configuration of a device measuring intensity of electromagnetic field related to the first embodiment.

As shown in FIG. 1, this measuring device comprises a probe 10 in close vicinity to the DUT 1, the first current measuring device 21 as well as the second current measuring device 22 connected with the probe 10, a computer 30 processing data being outputted from the current measuring devices 21 and 22 respectively, and a shifter 40 to shift the probe 10 in close vicinity to the DUT 1. One terminal of the probe 10 is connected with the first current measuring device 21 via a coaxial cable 23. In addition, the other terminal of the probe 10 is connected with the second current measuring device 22 via the coaxial cable 24.

Figure 2:
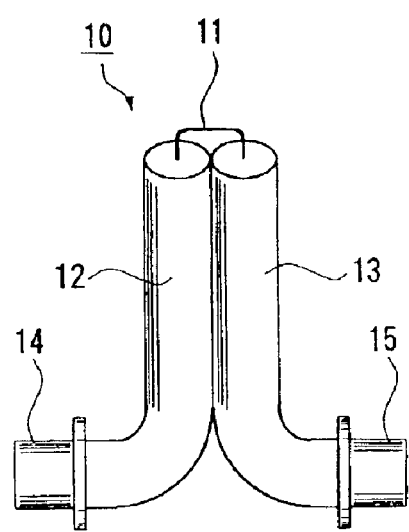
FIG. 2 is an explanatory view describing a probe related to the first embodiment.

As shown in FIG. 2, the probe 10 comprises a loop antenna 11. This loop antenna 11 does not comprise any shield. For the present embodiment, a square loop antenna has been adopted as the loop antenna 11 so that it may come in close vicinity to the DUT 1. The both ends of the loop antenna 11 are respectively connected with the central conductors of the coaxial cables 12 and 13. At the other ends of each of the coaxial cables 12 and 13, contact connectors 14 and 15 have been provided respectively. Each of the contact connectors 14 and 15 is connected with the first current measuring device 21 and the second current measuring device 23 respectively. For the present embodiment, the probe 10 has been configured for production by processing a coaxial cable with the exterior conductor being configured by copper, and the dielectric by fluoride resin respectively, and with the characteristic impedance of 50Ω and with the approximate diameter of 1 mm.

Figure 3:
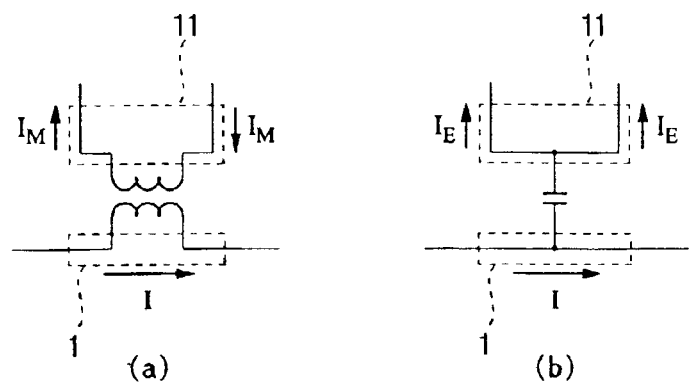
FIG. 3 is a conceptual view describing outputs from the loop antenna related to the first embodiment.

Here, the output from the both terminals of the probe 10 will be described with reference to a conceptual view of FIG. 3. As shown in FIG. 3(a), in the loop antenna 11, the magnetic coupling current $I_M$ generated by undergoing magnetic coupling with the electric current $I_{DUT}$ flows. This magnetic coupling current $I_M$ flows from one end of the loop antenna 11 to the other end party. The output direction of the magnetic coupling current $I_M$ is determined by the direction of the current $I_{DUT}$ flowing into the DUT 1. On the other hand, as shown in FIG. 3(b), an electric field is generated between the DUT 1 and the loop antenna 11. That is, the DUT 1 and the loop antenna 11 undergo electric coupling. Accordingly, an electric coupling current $I_E$ flows from a position standing opposite to the DUT 1 in the direction of departing from the DUT 1 in the loop antenna. Consequently, at one terminal party of the probe 10 the electric coupling current $I_E$+the magnetic coupling current $I_M$ is outputted, and at the other end party the electric coupling current $I_E$—the magnetic coupling current $I_M$ is outputted. That is, from the probe 10, a composite current of the electric coupling current $I_E$ and the magnetic coupling current $I_M$ is outputted.

The first current measuring device 21 measures the first composite electric current $I_1$ outputted from one end of the probe 10. The second electric current measuring device 22 measures the second composite current $I_2$ being outputted from the other end of the probe 10. In the present embodiment, a spectrum analyzer has been used as the current measuring devices 21 and 22. The electric current measuring devices 21 and 22 respectively output the result of measuring to the computer 30.

Figure 4:
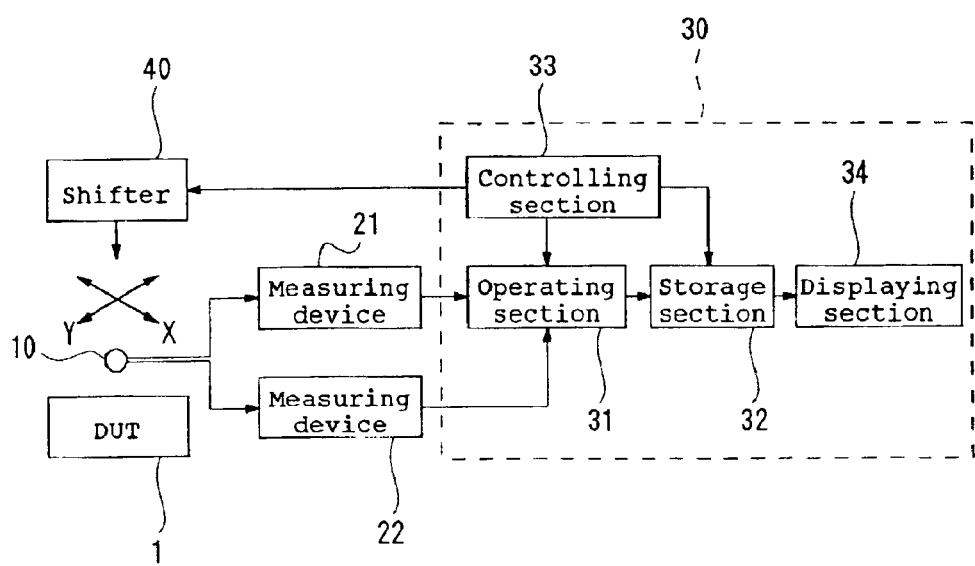
FIG. 4 is a block diagram describing the configuration of the device measuring intensity of electromagnetic field related to the first embodiment.

As shown in FIG. 4, the computer 30 comprises an operating section 31 calculating intensity of the electromagnetic field in close vicinity to the DUT 1 by splitting it into an electric field component and a magnetic field component, a storage section 32 storing the result calculated by the operating section 31, a controlling section 33 controlling the operation of the shifter 40, and a displaying section 34 displaying the calculation result stored in the storage section 32.

The operating section 31 calculates the electric coupling current $I_E$ and the magnetic coupling current $I_M$ based on the composite electric current from each of electric current measuring devices 21 and 22. As having been said, the electric current $I_1$ having been measured by the first electric current measuring device 21 and the electric current $I_2$ having been measured by the second electric current measuring device 22 will be as follows:

$$I_1 = I_E + I_M \quad (1)$$

$$I_2 = I_E - I_M \quad (2)$$

Accordingly, the above-described equations (1) and (2) are simultaneously solved to calculate the electric coupling current component $I_E$ as $(I_1+I_2)/2$ and the magnetic coupling current component $I_m$ as $(I_1-I_2)/2$. In the storage section 32, which is cooperative with the controlling section 33, the result of calculation in each shifted position of the probe 10 is stored. With this, intensity distribution on the electromagnetic field is produced.

The shifter 40 shifts the probe 10 by the signal from the said controlling section 33 in the X direction and in the Y direction on the parallel plane keeping a constant distance from the top surface of the DUT 1. This will parallel-shift the probe 10 along the top surface of the DUT 1 under condition that the loop antenna 11 is made to come in close vicinity to the DUT 1, for example, in close vicinity of up to approximately 2 mm to the DUT 1.

Thus, in the present embodiment, the electric coupling current $I_E$ and the magnetic coupling current $I_M$ can be easily obtained based on the first composite electric current $I_1$ and the second composite electric current $I_2$ outputted from both ends of the probe 10. Accordingly, the electric field component as well as the magnetic field component of intensity of the electromagnetic field in close vicinity to the DUT 1 can be easily obtained from the electric coupling current $I_E$ and the magnetic coupling current $I_M$. Moreover, with these magnetic field component and electric current component of intensity of the electromagnetic field, the electric current distribution as well as the voltage distribution in the DUT 1 can be measured. Here, the probe 10 does not necessarily require any shielding configuration and thus can be easily miniaturized. Such miniaturization improves resolution capacity on space. In addition, the probe configuration will provide higher degree of freedom. Moreover, the shifter 40 shifts the probe 10 in close vicinity to the DUT 1, and thus intensity distribution on the electromagnetic field can be obtained easily and certainly.

Incidentally, in the present embodiment, a loop antenna 11 without having any shielding configuration has been used, but a shielded loop antenna may be used. Incidentally, in that case, the electric coupling current $I_E$ will become small one. In addition, in the present embodiment, the loop antenna 11 has been shaped square, but may be otherwise shaped such as circular, etc. Moreover, in the present embodiment, the turn ratio of the loop antenna 11 has been set at one turn, but may be shaped with a plurality of turns. Otherwise, other products in terms of quality and sizes, etc. may be used.

In addition, in the present embodiment, two units of electric current measuring devices 21 and 22 have been used, but one unit of measuring device may be used. And in that case, after measuring one output of the probe 10 to obtain the first composite electric current, the other output may be measured to obtain the second composite electric current. In addition, after the outputs only at one side of the probe 10 is measured to obtain the first composite electric current, this probe 10 may be caused to rotate 180 degrees around the axis heading for the DUT 1 so that the outputs at the same side are measured again to obtain the second composite electric current.

Moreover, in the present embodiment, the shifter 40 has been controlled so as to shift the probe 10 to approach the DUT 1 at a predetermined distance, but shifting may be implemented in the direction closer to or remote from the DUT 1. This enables spacious measurement of intensity distribution on the electromagnetic field surrounding the DUT 1. In addition, in the present embodiment, the shifter 40 has been used to shift the probe 10 to obtain the intensity distribution on the electromagnetic field, but a numerous probes 10 which are disposed in close vicinity to the DUT 1 in a shape of matrix maybe changed over by a high frequency switch, etc. to measure intensity of the electromagnetic field at each position. In that case, the probe 10 which will not move can speed up measurement.

Figure 5:
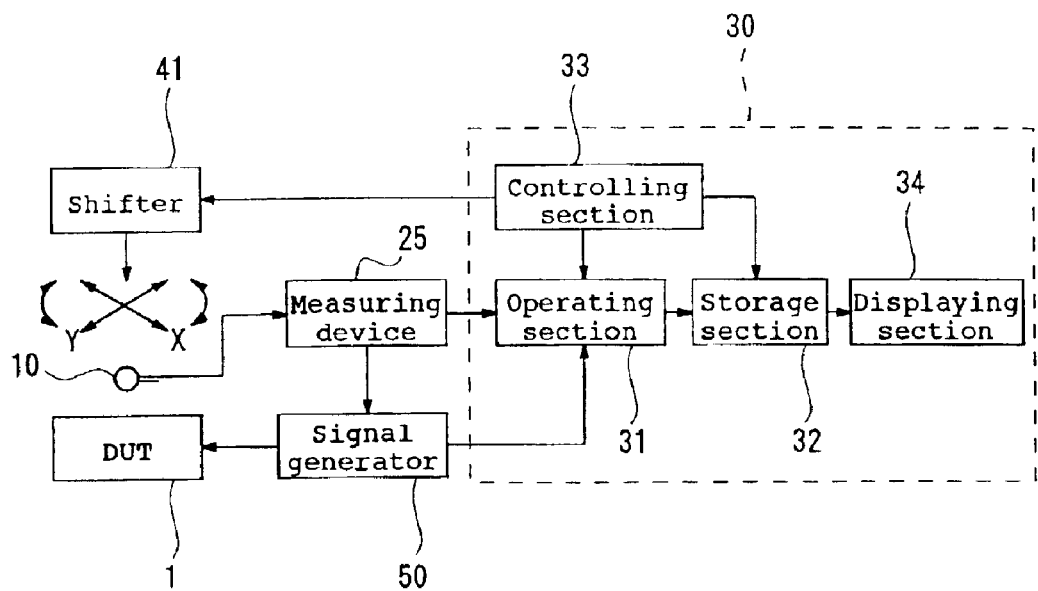
FIG. 5 is a block diagram describing the configuration of the device measuring intensity of electromagnetic field related to the second embodiment.

Next, the second embodiment of the present invention will be described with reference to FIG. 5. In FIG. 5, to those which are configured in the same way as in the first embodiment, the same numbers will be given and description thereon will be omitted.

The present embodiment is different from the first embodiment first in the point that the composite electric current being outputted from one end of the probe 10 is measured. And, for the purpose of measuring a plurality of composite electric currents, the shifter 41 is provided with a function to cause the probe 10 to rotate around the axis heading for the DUT 1.

In addition, the present embodiment, a vector signal analyzer has been used as the current measuring device 25. That is, the current measuring device 25 also measures phase difference in the input signals. This current measuring device 25 outputs a reference signal to the signal generator 50. The signal generator 50 supplies the driving signal which synchronizes with the reference signal of the electric current measuring device 25 as the driving signal of the DUT 1. That is, the DUT 1 does not operate based on the clock signals of its own but operates based on the clock signal of the signal generator 50. This enables the electric current measuring device 25 to measure the electric current value as well as to accurately detect the phase difference.

Thus, in the configuration, the operating section 31 of the computer 30 calculates intensity of the electromagnetic field as follows. First, actual electric current $I_{DUT}(x, y)$ and voltage $V(x, y)$ are expressed as follows:

$$I(x, y) = a(x, y) \sin(\omega t + \theta_{h(x, y)}) \quad (3)$$

$$V(x, y) = b(x, y) \sin(\omega t + \theta_{\ominus(x, y)}) \quad (4)$$

Figure 6:
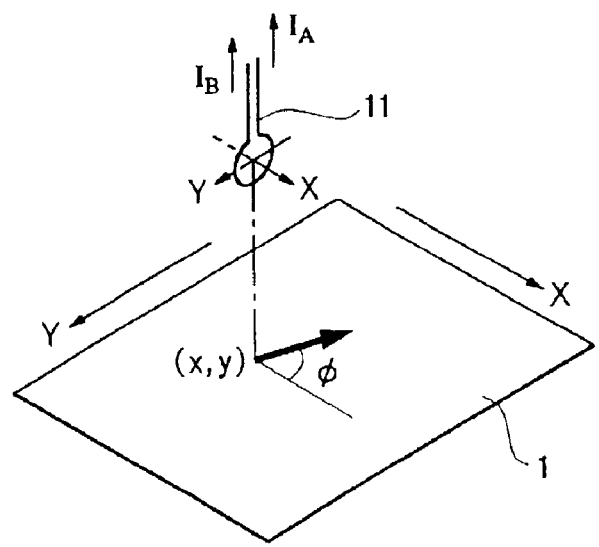
FIG. 6 is an explanatory view describing the configuration of the device measuring intensity of electromagnetic field related to the second embodiment.
Figure 7:
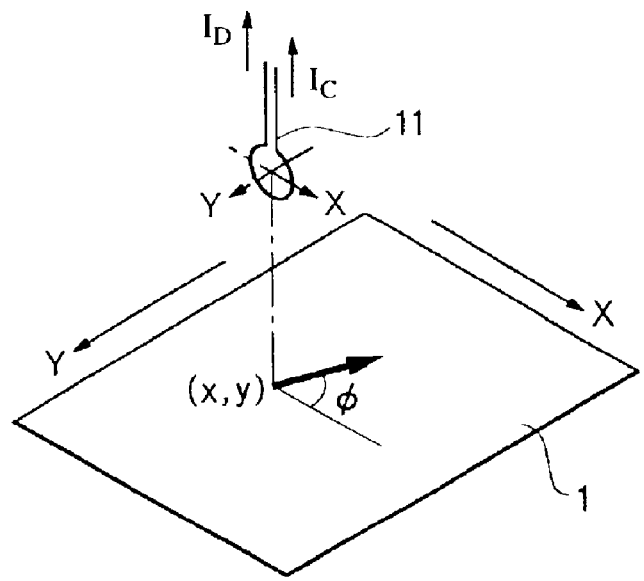
FIG. 7 is an explanatory view describing the configuration of the device measuring intensity of electromagnetic field related to the second embodiment.

In addition, as shown in FIG. 6 and FIG. 7, the direction of electric current is expressed using an angle $\phi$ from the x axis. In the drawing, the arrow in bold type having been indicated at the point (x, y) is a vector expressing electric current. Incidentally, a and b are coefficients, $\omega$ is the angular velocity, and $\theta_h$ and $\theta_\ominus$ are phase differences.

As shown in FIG. 6, a loop antenna 11 is disposed at a position remote at the point (x, y) in the direction perpendicular with the XY plane. Here, the loop antenna 11 is disposed so that the winding axis is directed along the X axis. At that time, the first composite electric current $I_A(x, y)$ as well as the second electric composite current $I_B(x,y)$ outputted from the both ends of the loop antenna 11 will be as follows:

$$I_A(x, y) = \alpha b(x, y)\sin(\omega t + \theta_{\ominus(x, y)}) + \beta a(x, y)\sin(\omega t + \theta_{h(x, y)})\sin\phi \quad (5)$$

$$I_B(x, y) = \alpha b(x, y)\sin(\omega t + \theta_{\ominus(x, y)}) - \beta a(x, y)\sin(\omega t + \theta_{h(x, y)})\sin\phi \quad (6)$$

Likewise, as shown in FIG. 7, when the loop antenna 11 is disposed so that the winding axis is directed along the Y axis, the third composite electric current $I_C(x, y)$ as well as the forth composite electric current $I_D(x, y)$ outputted from the both ends of the loop antenna 11 will be as follows:

$$I_C(x, y) = \alpha b(x, y)\sin(\omega t + \theta_{\ominus(x, y)}) + \beta a(x, y)\sin(\omega t + \theta_{h(x, y)})\cos\phi \quad (7)$$

$$I_D(x, y) = \alpha b(x, y)\sin(\omega t + \theta_{\ominus(x, y)}) - \beta a(x, y)\sin(\omega t + \theta_{h(x, y)})\cos\phi \quad (8)$$

Incidentally, $\alpha$ as well as $\beta$ are coefficients. In addition, in the above-described equations (5) through (8), the first term is the electric coupling current $I_E$ and the second term is the magnetic coupling current $I_M$. Moreover, in the above-described equations (5) through (8), when the value of the second term is great, that is, the magnetic coupling current $I_M$ is great, there are chances that values happen to be negative. In the present embodiment, a vector signal analyzer is used as the electric current measuring device 25, and therefore, if $I_A(x, y)$ and $I_B(x, y)$ are compared and in the same phase, the both signals are determined to be positive, and if in opposite phases, one is determined to give a negative value. Comparison between $I_C(x, y)$ and $I_D(x, y)$ will result in the same way.

The above will result in the followings:

$$I_A(x, y) + I_B(x, y) = I_C(x, y) + I_D(x, y) = 2\alpha b(x, y)\sin(\omega t + \theta_{\ominus(x, y)}) \quad (9)$$

$$I_A(x, y) - I_B(x, y) = 2\beta a(x, y)\sin(\omega t + \theta_{h(x, y)})\sin\phi \quad (10)$$

$$I_C(x, y) - I_D(x, y) = 2\beta a(x, y)\sin(\omega t + \theta_{h(x, y)})\cos\phi \quad (11)$$

Now, these equations are simultaneously solved so that the electric current $I_{DUT}(x, y)$ as well as the voltage $V(x, y)$ in the DUT 1 at the point (x, y), and moreover the angular $\phi$ of electric current can be estimated.

Accordingly, in the present embodiment, at first the shifter 41 is used to successively rotate the probe 10 for 90 degrees at a time so that the said $I_A(x, y)$ through $I_D(x, y)$ are measured with the electric current measuring device 25. Based on this, the operating section 31 calculates the electric coupling current $I_E$ as well as the magnetic coupling current $I_M$. This will serve to make it possible to calculate the intensity of electromagnetic field in close vicinity to the point (x, y) of the DUT 1 by splitting it into the electric field component and the magnetic field component. Moreover, this will serve to make it possible to estimate the electric current $I_{DUT}(x, y)$ as well as the voltage $V(x, y)$ and the direction of the electric current $\phi$ in the DUT 1 at the point (x, y). In addition, the shifter 41 can be shifted on the XY plane so that the electric current-voltage distribution in the DUT 1 can be obtained. Other functions and advantages are the same as in the first embodiment.

Incidentally, in the present embodiment, a loop antenna 11 not being shaped in a shielding configuration has been used, but a shielded loop antenna may be used. In that case, the electric coupling current will become small. In addition, in the present embodiment, the loop antenna 11 has been squarely shaped, but may be shaped otherwise such as circular, etc. Moreover, in the present embodiment, the turn ratio of the loop antenna 11 has been set at one turn, but may be shaped involving a plurality of turns. As concerns other points, such as quality and sizes, etc., another one may be used.

In addition, in the present embodiment, one unit of electric current measuring device 25 has been used, but as in the first embodiment, a plurality of measuring devices may be used.

Moreover, in the present embodiment, the probe 10 has been arranged to rotate so that the winding axis of the loop antenna 11 is disposed parallel along the top surface of the DUT 1, but nothing sets limitation thereon, and a plurality of composite electric currents may be measured with the loop antenna 11 being made to rotate in other directions. In addition, the rotation angle thereof is not limited to 90 degrees at a time, but other angles may be adopted.

Moreover, in the present embodiment, the shifter 41 has implemented shifting only in close vicinity to the top surface of the DUT 1 in the parallel direction, but may implement shifting in the direction of approaching or coming apart from the DUT 1. This will serve to make it possible to spatially obtain intensity distribution of the electric field surrounding the DUT 1.

Moreover, in the present embodiment, the probe 10 has been shifted using the shifter 41 so as to obtain intensity distribution of the electromagnetic field, but a number of probes 10, which are disposed in a matrix shape in close vicinity to the DUT 1, may undergo switching with a high frequency switch, etc. so that the intensity of the electromagnetic field at respective positions is measured. In that case, the probe 10, which will not move at all, will be able to speed up measurement.

Next, the third embodiment of the present invention will be described with reference to drawings. The measuring device on intensity of the electromagnetic field measures intensity distribution of the electromagnetic field in close vicinity of the DUT 1. In the case, for example, where the circuit substrate of electronic device or especially a component is expected to undergo measurement, the DUT 1 will be the one with the components which have been mounted on the substrate to be measured. When measurement is implemented, the DUT 1 will be put under operation. The measuring device measures intensity of the electromagnetic field to be formed by the electromagnetic waves radiated from the DUT 1 in the midst of operation.

Figure 8:
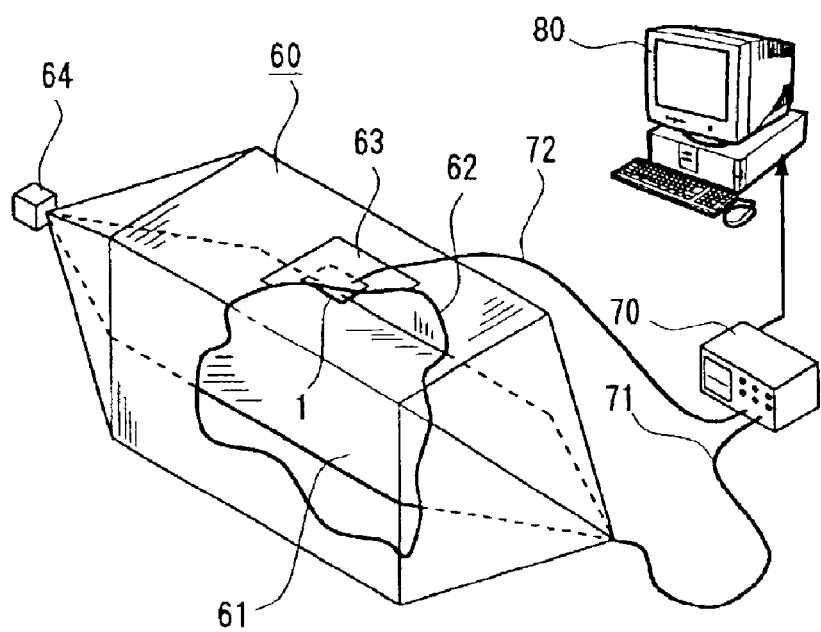
FIG. 8 is an explanatory view describing the configuration of the device measuring intensity of electromagnetic field related to the third embodiment.

As shown in FIG. 8, this measuring device comprises a TEM Cell (Transverse ElectroMagnetic Cell) 60 which is a kind of coaxial transmission line, an electric current measuring device 70 connected with one end of the TEM Cell 60, and a computer 80 to calculate data outputted from the electric current measuring device 70. The TEM Cell 60 is connected with the electric current measuring device 70 via a coaxial cable 71.

The TEM Cell 60 is a square-transmission line of characteristic impedance 50 Ω. That is, the TEM Cell 60 comprises a central conductor 61 and an exterior conductor 62. In the top surface of the TEM Cell 60, a square cover 63 is provided. In the internal central section of the cover 63, the DUT 1 is disposed. This DUT 1 is disposed between the exterior conductor 62 and the central conductor 61. One end of the central conductor 61 is connected with the said electric current measuring device 70, and the other end is connected with the terminal resistance 64 which is 50Ω.

Figure 9:
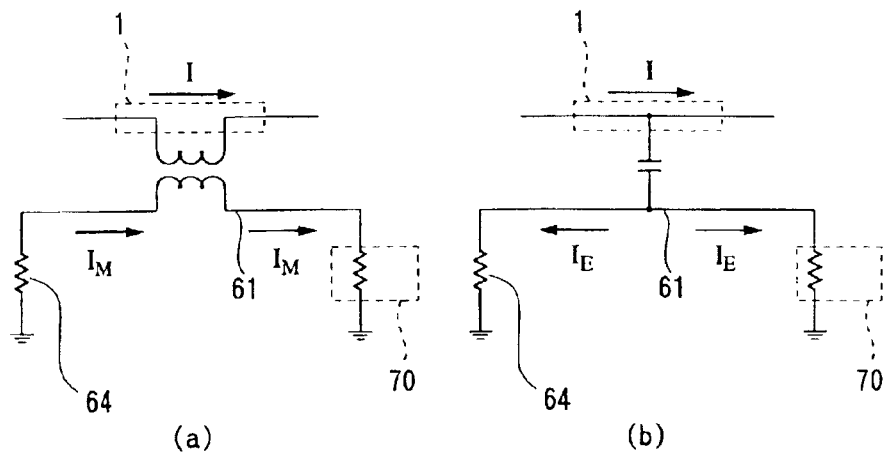
FIG. 9 is a conceptual view describing outputs from the TEM Cell related to the third embodiment.

Here, the outputs from the central conductor 61 of the TEM Cell 60 will be described with reference to the conceptual view in FIG. 9. As shown in FIG. 9(a), in the central conductor 61 of the TEM Cell 60, the magnetic coupling current $I_M$, which is generated undergoing magnetic coupling with the electric current $I_{DUT}$ flowing in the DUT 1, flows. This magnetic coupling current $I_M$ flows from one end of the central conductor 61 to the other end party thereof. Here, the direction of output of the magnetic coupling current $I_M$ is determined by the direction of the electric current $I_{DUT}$ flowing into the DUT 1. On the other hand, as shown in FIG. 9(b), there gives rise to an electric field between the DUT 1 and the central conductor 61. That is, the DUT 1 and the central conductor 61 undergo electric coupling. Accordingly, in the central conductor 61, the electric coupling current $I_E$ flows from the section standing opposite the DUT 1 to the direction of both ends of the TEM Cell 60. This will serve to cause electric coupling current $I_E$+magnetic coupling current $I_M$ to be outputted in one terminal party of the TEM Cell 60, and electric coupling current $I_E$–magnetic coupling current $I_M$ to be outputted in the other end party. That is, from the TEM Cell 60, the composite electric current of the electric coupling current $I_E$ and the magnetic coupling current $I_M$ is outputted.

The electric current measuring device 70 measures the composite electric current outputted from the central conductor 61. In the present embodiment, a network analyzer has been used. That is, the electric current measuring device 70 causes the DUT 1 to change the frequency via a coaxial cable 72 and to input the driving signal thereto, and on the other hand measures the output from the central conductor 61. The electric current measuring device 70 outputs the results of measurement into the computer 80.

Figure 10:
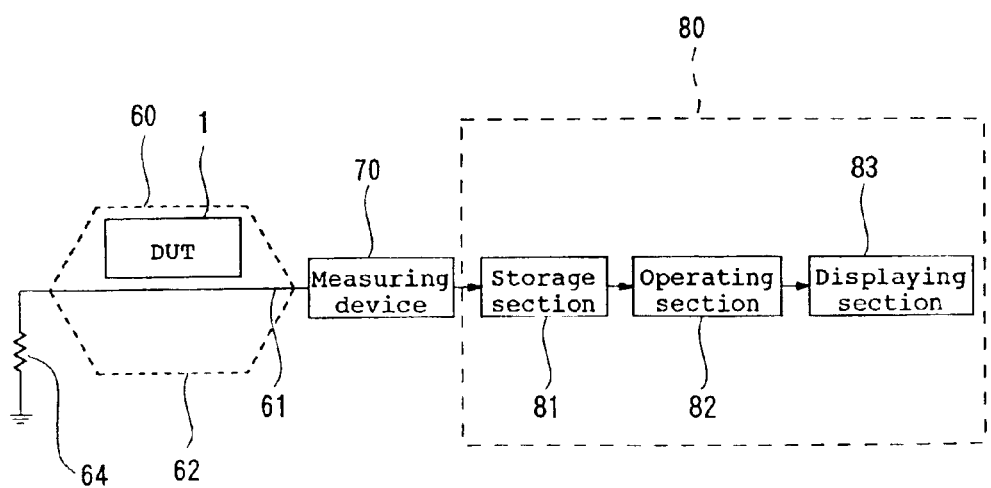
FIG. 10 is a block diagram describing the configuration of the device measuring intensity of electromagnetic field related to the third embodiment.

As shown in FIG. 10, the computer 80 comprises a storage section 81 for temporarily storing the results of measurement to be inputted from the electric current measuring device 70, an operating section 82 for splitting intensity of the electromagnetic field in close vicinity to the DUT 1 from a plurality of composite electric currents stored in the storage section 81 into the electric field component and the magnetic field component and calculating the intensity of the electromagnetic field, and a displaying section 83 for displaying the result of calculation.

Incidentally, the composite electric current outputted from one end of the TEM Cell 60 will take different values based on the disposition angle of the DUT 1. This is because the direction where the magnetic coupling current $I_M$ flows is determined by the current $I_{DUT}$ flowing into the DUT 1. Incidentally, the value of the electric coupling current $I_E$, which is determined by holistic potential of the DUT 1, will not be influenced by the disposition angle of the DUT 1. Accordingly, when the direction of the electric current $I_{DUT}$ flowing into the DUT 1 constitutes an angle θ with one edge of the cover 63, the first composite electric current $I_A$ to be outputted from one end of the TEM Cell 60 will be as follows:

$$I_A = I_E + I_M \cos θ \quad (12)$$

Here, when the cover 63 inclusive of the DUT 1 is caused to consecutively rotate 90 degrees at a time, the second composite current $I_B$ through the forth composite currents $I_D$ to be outputted from one end of the TEM Cell 60 will be respectively as follows:

$$I_B = I_E - I_M \sin θ \quad (13)$$

$$I_C = I_E - I_M \cos θ \quad (14)$$

$$I_D = I_E + I_M \sin θ \quad (15)$$

Accordingly, the computer 80 stores in the storage section 81 four composite electric current values $I_A$ through $I_D$ obtained by causing the angle of the DUT 1 to rotate consecutively 90 degrees at a time, and thereafter simultaneously solves the above-described equations (12) through (15) based on the first composite current $I_A$ through the forth composite current $I_D$. This will serve to make it possible to calculate the magnetic coupling current $I_M$ as well as the electric coupling current $I_E$, and moreover the principal current direction θ in the DUT 1. In addition, the operating section 82 can split intensity of the electromagnetic field into the electric field component and the magnetic field component based on this magnetic coupling current $I_M$ as well as the electric coupling current $I_E$ for calculation.

Next, practical examples using the present measuring method will be described. In the first practical example, as the DUT 1, several centimeters of conductor have been selected. The conductor as the DUT 1 has been disposed so that it makes 0° in the longitudinal direction against one edge of the said cover 63. That is, the angle θ=0°. One end of the conductor being the DUT 1 is connected to the network analyzer being the electric current measuring device 70. The other end of the conductor ends at 50Ω. This DUT 1 has undergone measurement of current values at four rotation angles with the cover 63 being rotated, and the magnetic coupling current $I_M$ as well as the electric coupling current $I_E$, and moreover the principal current direction θ in the DUT 1 have been measured. In addition, the measurement has been implemented every 5 MHz within a range between 150 kHz through 1 GHz. As a result, the graphs in FIG. 11 have been obtained.

Likewise, in the second practical example, the said conductor has been disposed so that it makes 20° against one edge of the said cover 63 for measuring. That is, the angle θ=0°. Other measurement conditions are the same as in the first practical example. As a result, the graphs in FIG. 12 have been obtained.

Moreover, in the third practical example, as the DUT 1, a micro strip line (hereinafter to be referred to as MSL) has been selected. The MSL as the DUT 1 has been disposed so that it makes 45° in the longitudinal direction against one edge of the said cover 63. That is, the angle θ=45°. Other measurement conditions are the same as in the first practical example. As a result, the graphs in FIG. 13 have been obtained.

Figure 11:
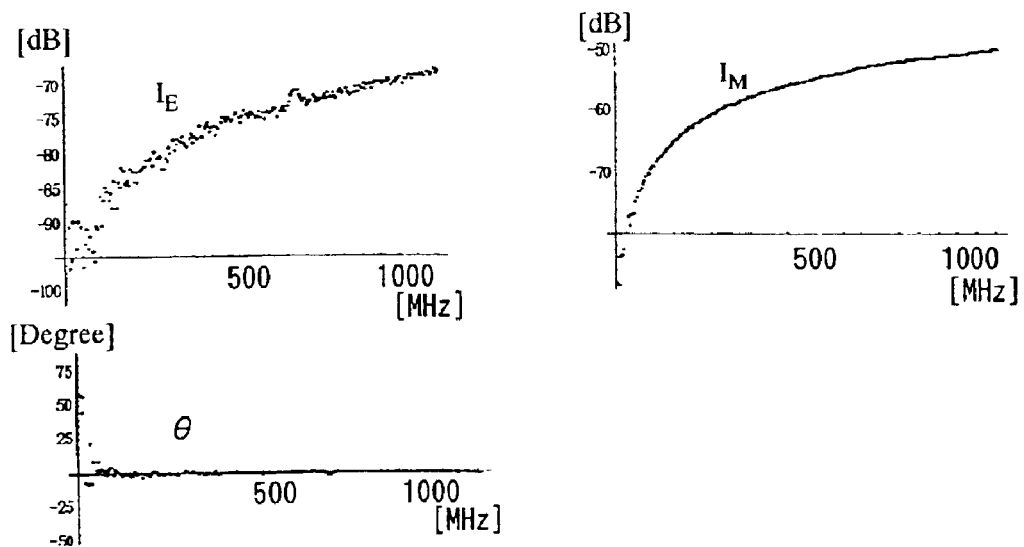
FIG. 11 is a graph indicating the results of measurement related to the third embodiment.
Figure 12:
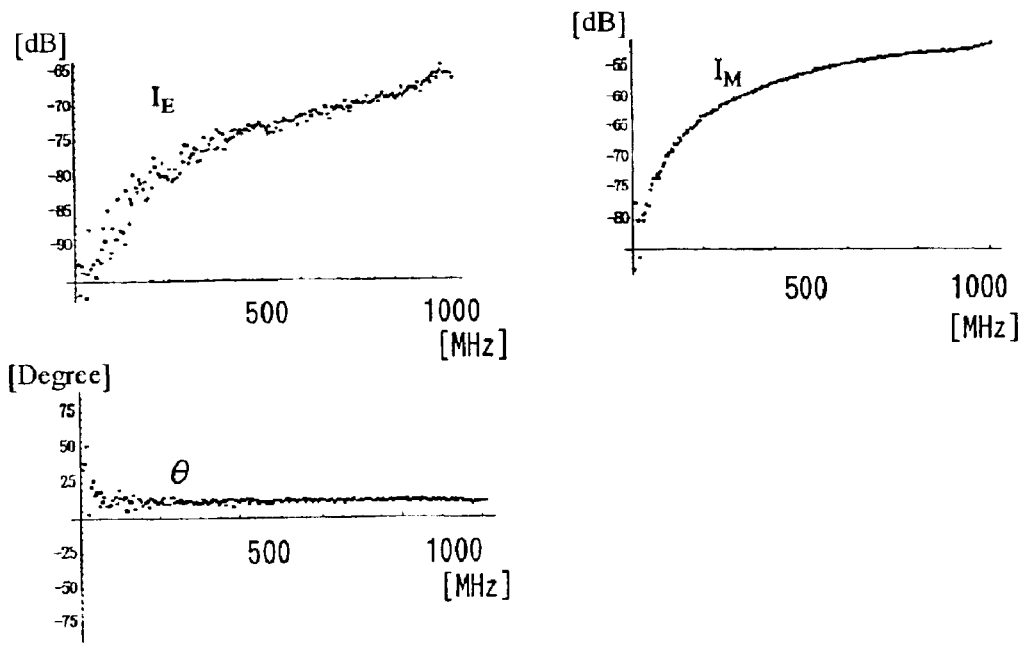
FIG. 12 is a graph showing other result of measurement related to the third embodiment.
Figure 13:
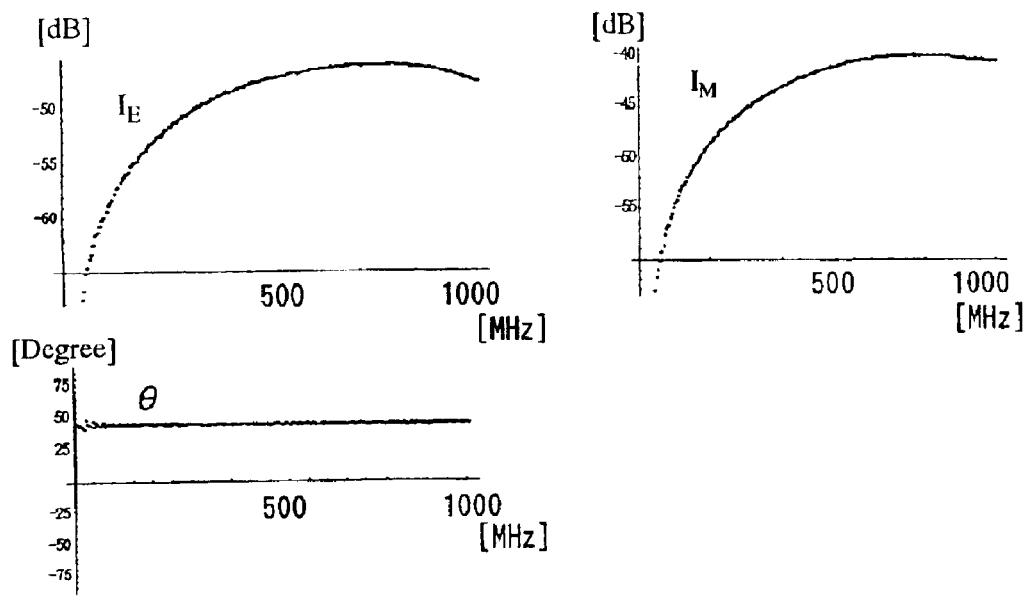
FIG. 13 is a graph showing other result of measurement related to the third embodiment.

As shown in FIG. 11 through FIG. 13, in theory, it has been confirmed that almost accurate values have been measured.

Figure 14:
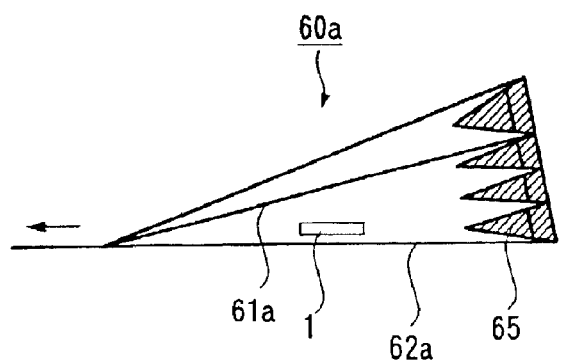
FIG. 14 is a sectional view describing the configuration from the G-TEM Cell related to other examples of the third embodiment.

Incidentally, in the present embodiment, the TEM Cell 60 has been used as the coaxial transmission line, but a G-TEM Cell 60a as shown in the sectional view in FIG. 14 may be used. One end party of this G-TEM Cell 60a ends with an electromagnetic waves absorbent 65. This G-TEM Cell 60a will be excellent in measurement especially in high frequencies.

In addition, in the present embodiment, as the terminal resistance 64, the one with impedance of 50Ω has been used, but without being limited thereto, other impedance values may be adopted for the terminal end.

Moreover, in the present embodiment, as the cover 63 of the TEM Cell 60, a square shaped one has been used so as to enable 90° rotation easily, but the cover 63 may be shaped polygonal such as circular, hexagonal and octagonal, etc. In addition, the rotation angle thereof may be other angles without being limited to every 90°.

Figure 15:
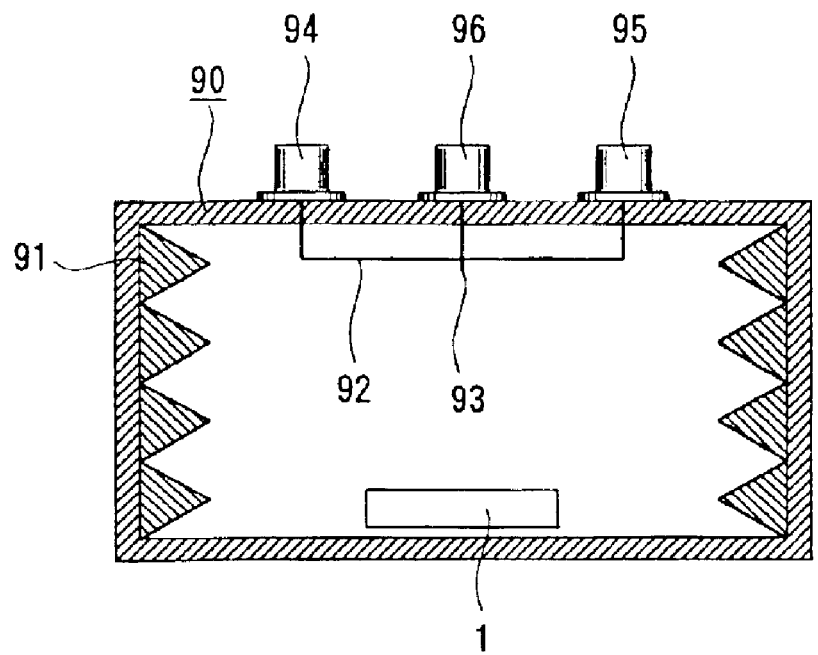
FIG. 15 is a sectional view on a box related to other examples of the third embodiment.
Figure 16:
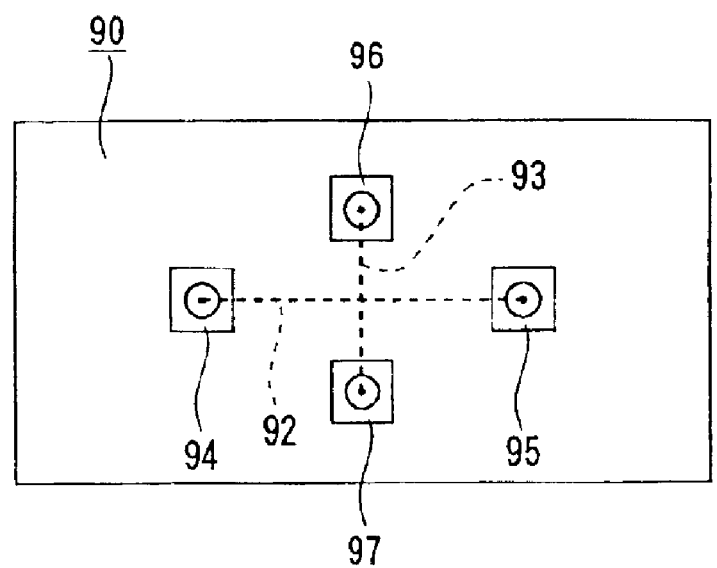
FIG. 16 is a top view related to other examples of the third embodiment.

Moreover, instead of the TEM Cell 60, a box 90 as shown in FIG. 15 and FIG. 16 may be used. FIG. 15 shows a sectional view of the box 90 and FIG. 16 shows a top view of the box 90. To the inside party of the box 90, electromagnetic waves absorbents 91 are attached. The DUT 1 is disposed on the bottom plane of the box 90. On the top section of the box 90, two internal conductors 92 and 93 have been disposed. These internal conductors 92 and 93 have been disposed on the ceiling surface of the box 90 so as to intersect at 90°. In addition, the both end sections of each internal conductor 92 are connected to connectors 94 through 97 having been disposed on the top plane of the box 90. Thus, in the box 90, outputs from respective connectors 94 through 97 may well be measured with the electric current measuring device 70. Incidentally, each internal conductor 92 may be the one having a shielding configuration utilizing a coaxial cable, etc.

Next, uses of the present invention will be described. At first, measurement on intensity of the electromagnetic field which is formed surrounding electronic device enables assessment on the electronic device. In recent years, a problem has been posed to unnecessary electromagnetic waves radiated from electronic device. Therefore, the present invention may well be utilized for selecting electronic device in stages of production of electronic device. In particular, utilizing the present invention to measure intensity of the electromagnetic field of electronic device, the device may well be determined as good product when this intensity of the electromagnetic field appears not more than the predetermined reference value.

In addition, the present invention is also useful in the designing stage of electronic device. That is, for the purpose of designing electronic device with less radiation of unnecessary electromagnetic waves, it will make such measures as design alterations, etc. easier if information on from which section of the electronic device the electromagnetic waves are being radiated strongly can be known. This can be estimated from the intensity distribution of the electromagnetic fields surrounding electronic device and current-voltage distribution of electronic device which can be obtained utilizing the present invention.

Thus, with the present invention being utilized in the designing stage or in the production stage of electronic device, electronic device from which radiation of unnecessary electromagnetic waves has been relieved can be obtained.

Incidentally, the embodiments which have been described in the present invention are presented as examples and should not be deemed limiting. The scope of the present invention will be indicated by the claims attached hereto, and all variations to be covered by the meanings of those claims will be included in the present invention.

We claim:

1. Apparatus for deriving an indication of at least one of a magnetic and electric field component of an electromagnetic field from a device-under-test, the apparatus comprising an electromagnetic field detector probe including a conductor shaped as a loop and having opposite first and second ends, the loop having a portion adapted to be electromagnetically coupled with the device-under-test, the probe being arranged so that it does not include a shield that affects the electromagnetic field coupled between the device under test and the loop portion, the loop being arranged so that (a) in response to the magnetic field component a first current component $I_m$ flows from the first end to the second end and (b) in response to the electric field component second and third equal amplitude current components $I_e$ flow in the same direction through the first and second ends so that currents $I_1$ and $I_2$ flowing through the first and second ends respectively have values directly proportional to $(I_e+I_m)$ and $(I_e-I_m)$, and circuitry connected to be response to the currents $I_1$ and $I_2$ for deriving at least one output signal having a value commensurate with the at least one of the magnetic and electric field components, and a scanner for moving the detector probe relative to the device-under-test in a region adjacent the device-under-test so that as the probe moves in the region, the loop portion is coupled with different electric and magnetic field components derived by the device under test, causing the currents $I_1$ and $I_2$ change, and the values of $(I_e+I_m)$ and $(I_e-I_m)$ to change, the circuitry being arranged to respond to the values of $I_1$ and $I_2$ for deriving an indication of the distribution of the electromagnetic field of the device-under-test in the region.

2. The apparatus of claim 1 wherein the apparatus is arranged for deriving indications of both the magnetic and electric field components and the circuitry is arranged for deriving first and second output signals respectively having values commensurate with the magnetic and electric field components.

3. The apparatus of claim 2 wherein the circuitry is arranged for deriving the first and second output signals by combining $I_1$ and $I_2$ in accordance with $I_1+I_2=(I_e+I_m)+(I_e-I_m)=2I_e$ and $I_1-I_2=(I_e+I_m)-(I_e-I_m)=2I_m$, respectively.

4. The apparatus of claim 1 wherein the at least one output signal has a value commensurate with the magnetic field component and the circuitry is arranged for deriving the output signal having a value commensurate with the magnetic field component by combining $I_1$ and $I_2$ in accordance with $I_1-I_2=(I_e+I_m)-(I_e-I_m)=2I_m$.

5. The apparatus of claim 1 wherein the at least one output signal has a value commensurate with the electric field component and the circuitry is arranged for deriving the output signal having a value commensurate with the electric field component by combining $I_1$ and $I_2$ in accordance with $I_1+I_2=(I_e+I_m)+(I_e-I_m)=2I_e$.

6. A method of deriving an indication of at least one of a magnetic and electric field component of an electromagnetic field from a device-under-test, the method comprising electromagnetically coupling an electromagnetic field detector probe including a conductor shaped as a loop and having opposite first and second ends with the device-under-test, the loop having a portion electromagnetically coupled with the device under test, the probe being arranged so that it does not include a shield that affects the electromagnetic field coupled between the device under test and the loop portion, the loop portion being arranged so that (a) in response to the magnetic field component coupled from the device-under-test to the loop portion, a first current component $I_m$ flows from the first end to the second end and (b) in response to the electric field component second and third equal amplitude current components $I_e$ flow in the same direction through the first and second ends so that currents $I_1$ and $I_2$ flowing through the first and second ends respectively have values directly proportional to $(I_e+I_m)$ and $(I_e-I_m)$, responding to the currents $I_1$ and $I_2$ to derive at least one output signal having a value commensurate with the at least one of the magnetic and electric field components, and moving the detector probe relative to the device-under-test in a region adjacent the device-under-test so that as the probe moves in the region, the portion is coupled with different electric and magnetic field components derived by the device under test, causing the currents $I_1$ and $I_2$ change, and the values of $(I_e+I_m)$ and $(I_e-I_m)$ to change, the circuitry responding to the values of $I_1$ and $I_2$ by deriving an indication of the distribution of the electromagnetic field of the device-under-test in the region.

7. The method of claim 6 wherein the method derives indications of both the magnetic and electric field components and the response to the currents $I_1$ and $I_2$ results in the derivation of first and second output signals respectively having values commensurate with the magnetic and electric field components.

8. The method of claim 7 wherein the first and second output signals are derived by combining $I_1$ and $I_2$ in accordance with $I_1+I_2=(I_e+I_m)+(I_e-I_m)=2I_e$ and $I_1-I_2=(I_e+I_m)-(I_e-I_m)=2I_m$, respectively.

9. The method of claim 6 wherein the at least on output signal has a value commensurate with the magnetic field component and the output signal having a value commensurate with the magnetic field component is derived by combining $I_1$ and $I_2$ in accordance with $I_1+I_2=(I_e+I_m)-(I_e-I_m)=2I_m$.

10. The method of claim 6 wherein the at least one output signal has a value commensurate with the electric field component and the output signal having a value commensurate with the electric field component is derived by combining $I_1$ and $I_2$ accordance with $I_1+I_2=(I_e+I_m)-(I_e+I_m)=2I_e$.

11. Apparatus for deriving an indication of at least one of a magnetic and electric field component of an electromagnetic field from a device-under-test, the apparatus comprising an electromagnetic field detector probe including a conductor shaped as a loop and having opposite first and second ends, the loop having a portion adapted to be electromagnetically coupled with the device-under-test, the probe being arranged so that it does not include a shield that affects the electromagnetic field coupled between the device under test and the loop portion, the loop being arranged so that (a) in response to the magnetic field component a first current component $I_m$ flows from the first end to the second end and (b) in response to the electric field component second and third equal amplitude current components $I_e$ flow in the same direction through the first and second ends so that currents $I_1$ and $I_2$ flowing through the first and second ends respectively have values directly proportional to $(I_{e+Im})$ and $(I_e-I_m)$, and circuitry connected to be responsive to the currents $I_1$ and $I_2$ for deriving at least one output signal having a value commensurate with at least one of the magnetic electric field components, the loop portion being arranged to be coupled with different electric and magnetic field components derived by the device under test for causing at least one of currents $I_1$ and $I_2$ to change and the values of $(I_e+I_m)$ and $(I_e-I_m)$ to change as changes in at least one of the magnetic and electric field components coupled to the loop portion occur, the circuitry being arranged to respond to the values of $I_1$ and $I_2$ for deriving an indication of the distribution of the electromagnetic field of the device-under-test in the region.

12. A method of deriving an indication of at least one of a magnetic and electric field component of an electromagnetic field from a device-under-test, the method comprising electromagnetically coupling an electromagnetic field detector probe including a conductor shaped as a loop and having opposite first and second ends with the device-under-test, the loop having a portion electromagnetically coupled with the device under test, the probe being arranged so that it does not include a shield that affects the electromagnetic field coupled between the device under test and the loop portion, the loop portion being arranged so that (a) in response to the magnetic field component coupled from the device-under-test to the loop portion, a first current component $I_m$ flows from the first end to the second end and (b) in response to the electric field component second and third equal amplitude current components $I_e$ flow in the same direction through the first and second ends so that currents $I_1$ and $I_2$ flowing through the first and second ends respectively have values directly proportional to $(I_e+I_m)$ and $(I_e-I_m)$ responding to the currents $I_1$ and $I_2$ derive at least one output signal having a value commensurate with at least one of the magnetic and electric field components, coupling at least one of different electric and magnetic field components derived by the device under test to the portion to cause at least one of the currents $I_1$ and $I_2$ to change and at least one of the values of $(I_e+I_m)$ and $(I_e-I_m)$ to change, the circuitry responding to the values of $I_1$ and $I_2$ by deriving an indication of the distribution of the electromagnetic field of th device-under-test in the region.

* * * * *